(12) United States Patent
Kautzsch

(10) Patent No.: US 9,550,669 B2
(45) Date of Patent: Jan. 24, 2017

(54) VERTICAL PRESSURE SENSITIVE STRUCTURE

(75) Inventor: Thoralf Kautzsch, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 949 days.

(21) Appl. No.: 13/368,370

(22) Filed: Feb. 8, 2012

(65) Prior Publication Data

US 2013/0199301 A1 Aug. 8, 2013

(51) Int. Cl.
| | |
|---|---|
| *G01L 9/00* | (2006.01) |
| *G01L 9/16* | (2006.01) |
| *H01S 4/00* | (2006.01) |
| *H01L 21/336* | (2006.01) |
| *H01L 21/311* | (2006.01) |
| *B81C 1/00* | (2006.01) |
| *H04R 19/00* | (2006.01) |
| *H04R 31/00* | (2006.01) |

(52) U.S. Cl.
CPC ......... *B81C 1/00158* (2013.01); *H04R 19/005* (2013.01); *H04R 31/00* (2013.01); *B81B 2201/0257* (2013.01); *B81B 2201/0264* (2013.01); *B81B 2203/053* (2013.01); *B81C 2201/014* (2013.01)

(58) Field of Classification Search
None
See application file for complete search history.

(56) References Cited

U.S. PATENT DOCUMENTS

| | | | |
|---|---|---|---|
| 6,250,165 B1 | 6/2001 | Sakai et al. | |
| 6,524,947 B1* | 2/2003 | Subramanian | .... H01L 21/76811 |
| | | | 257/E21.579 |
| 6,787,052 B1 | 9/2004 | Vaganov | |
| 7,555,956 B2 | 7/2009 | Benzel et al. | |
| 7,832,279 B2 | 11/2010 | Kautzsch et al. | |
| 8,429,808 B2* | 4/2013 | Huang | ............................ 29/594 |
| 2004/0198015 A1* | 10/2004 | Drabe | ............... H01L 27/10861 |
| | | | 438/391 |
| 2005/0095788 A1* | 5/2005 | O'Riain | ............ H01L 21/76224 |
| | | | 438/270 |
| 2006/0179642 A1* | 8/2006 | Kawamura | ...................... 29/594 |
| 2011/0068420 A1 | 3/2011 | Binder et al. | |
| 2011/0140216 A1 | 6/2011 | Qu | |
| 2011/0248363 A1 | 10/2011 | Fujii et al. | |
| 2015/0185426 A1* | 7/2015 | Miao | ....................... G02F 1/093 |
| | | | 385/33 |

FOREIGN PATENT DOCUMENTS

| | | |
|---|---|---|
| DE | 102005032635 A1 | 1/2007 |
| DE | 102007026450 A1 | 12/2008 |
| DE | 102009039106 A1 | 5/2010 |
| DE | 102011007217 A1 | 12/2011 |

OTHER PUBLICATIONS

Office Action dated Jan. 1, 2016 for German Patent Application No. 102013001674.6.

* cited by examiner

*Primary Examiner* — Peter Macchiarolo
*Assistant Examiner* — Jermaine Jenkins
(74) *Attorney, Agent, or Firm* — Schiff Hardin LLP

(57) ABSTRACT

Embodiments related to pressure sensitive structures are described and depicted.

19 Claims, 15 Drawing Sheets

VERTICAL PRESSURE SENSITIVE STRUCTURE

BACKGROUND

Pressure sensitive devices such as pressure sensors, microphones, etc. are devices capable of transducing a pressure applied to a pressure sensitive membrane into a signal such as an electric signal or vice versa.

Pressure sensitive devices are nowadays provided small-sized on substrates such as semiconductor substrates. By utilizing the many processing techniques for semiconductor materials such as silicon, small-sized pressure sensitive devices can be formed which are capable of being applied in many application fields. Typical applications include for example the monitoring of pressure in industrial or automotive applications. One of many examples for such applications includes a tire pressure monitoring system (TPMS) wherein the air pressure in tires of vehicles are sensed and reported to a control unit for determining and warning a driver when a low pressure condition occurs. Other applications include consumer or communication applications such as the transducing of speech by small-sized microphones in devices such as mobile phones, computers etc. or silicon loudspeakers provided in mobile phones etc.

BACKGROUND

According to one aspect, a method of manufacturing a pressure sensitive structure includes the generating of a plurality of trenches in a substrate, wherein adjacent trenches are separated from each other by a respective side-wall. After generating the plurality of trenches, material is removed to generate a cavity extending from a main surface of the substrate to at least one side-wall.

According to a further aspect, a method of manufacturing a pressure sensitive structure includes a generating of openings in a substrate, the openings extending from a first main surface vertically into the substrate, wherein a wall extending vertically into the substrate is formed between at least one pair of adjacent openings. Further material at a lateral side of a first opening of the at least one pair of openings is removed to laterally extend the first opening.

According to a further aspect, a device comprises at least one sealed opening extending from a main surface vertically into a substrate. The device includes a pressure membrane extending from the main surface vertically into the substrate and at least one further opening extending from the main surface of the substrate into the substrate to provide a pressure communication for the pressure membrane.

According to a further aspect, a pressure sensor includes at least one sealed opening extending vertical from a main surface of a semiconductor substrate into the semiconductor substrate, the at least one sealed opening being bounded on one side by a pressure sensitive wall. At least one pressure inlet is provided, the at least one pressure inlet extending from the pressure sensitive wall to the main surface from which the sealed opening extend into the substrate. The at least one pressure inlet is bound on an opposing side of the pressure sensitive wall by an inclined surface of the semiconductor substrate, the inclined surface being non-parallel to the pressure sensitive wall.

DETAILED DESCRIPTION

Figure 1A:
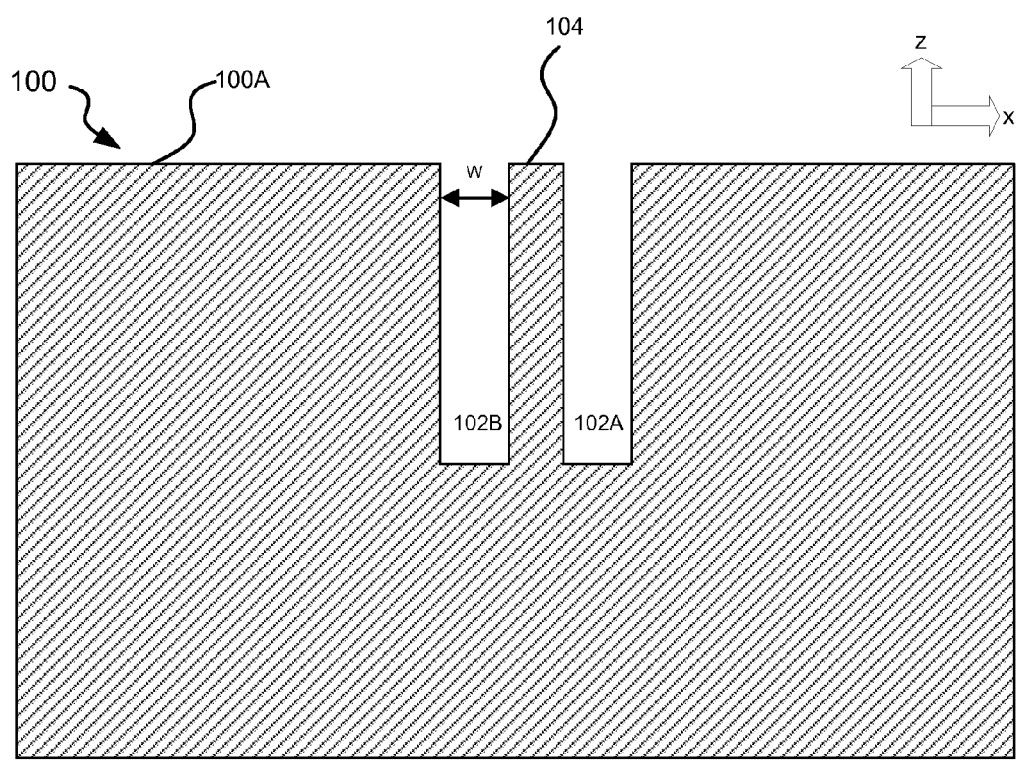
FIGS. 1A to 1E show example schematic cross-sectional views according to an embodiment.

The following detailed description explains exemplary embodiments of the present invention. The description is not to be taken in a limiting sense, but is made only for the purpose of illustrating the general principles of embodiments of the invention while the scope of protection is only determined by the appended claims.

Furthermore, the drawings may not been drawn to scale and may be simplified or rescaled. For example, some elements may be shown in the drawing with different scaling than other elements in order to provide a better understanding of embodiments.

Further, it is to be understood that the features of the various exemplary embodiments described herein or elements described with respect to the various exemplary embodiments may be combined with each other, unless specifically noted otherwise.

In the various figures, identical or similar elements, entities, modules, devices etc. may have assigned the same reference number.

In the following description, a lateral direction may be a direction parallel to a main surface of the substrate. Furthermore, a vertical direction may be a direction perpendicular to each lateral direction, i.e. perpendicular to the main surface of the substrate.

The embodiments described below are directed to a new concept for manufacturing vertical pressure sensitive structures. Distinguished from other pressure sensitive structures, vertical pressure sensitive structures such as vertical pressure sensors, vertical microphones etc. have a pressure sensitive membrane (lamella) which extends in vertical direction. The pressure sensitive membrane is therefore capable to sense a force caused by a pressure difference between the surrounding atmosphere and a pressure chamber by a deflection of the pressure sensitive membrane in the lateral direction.

Embodiments described herein allow manufacturing vertical pressure sensitive structures with the pressure inlet and the pressure sensitive structures being located at and being etched from the same main surface. The pressure sensitive structures can thereby be formed inside of the substrate with reduced complexity and lower costs. In some embodiments the manufacturing process may be integrated into a CMOS or BiCMOS process allowing manufacturing integrated circuits with integrated pressure sensitive elements.

FIGS. 1A-1E show a sequence of cross-sectional views in order to illustrate an embodiment for manufacturing a pressure sensitive device such as a pressure transducer or pressure sensor.

FIG. 1A shows a substrate 100 having a first main surface 100a and a second main surface 100b with trench openings 102A and 102B provided in the substrate 100. The substrate 100 may for example be a semiconductor substrate such as a silicon substrate. In some embodiments, the substrate 100 may be a wafer or a part of a wafer such as a semiconductor chip. In some embodiments, the substrate may have a composite structure including one or more deposited or doped regions or layers. In some embodiments, the substrate 100 may be a bulk substrate having one or more layers overlaying the bulk material. In some embodiments, the substrate 100 may be a pre-processed substrate wherein one or more processing steps such as etching, doping, material filling, cutting etc. may have been applied to the substrate. The drawings shown in FIGS. 1A-1E show a cross-sectional view of a plane spanned by the x- and z-directions. The z-direction being a direction perpendicular to the main surface is herein also referred to as the vertical direction. The x-direction being a direction parallel to the main surface 100$a$ is herein also referred to as a lateral direction. Furthermore, the y-direction which is not shown in the drawings of FIGS. 1A-1E is also parallel to the main surface and therefore referred to as a lateral direction.

The trench openings 102A and 102B are formed in the substrate 100 by removing material from the first main surface 100$a$ of the substrate. The trench openings are separated from each other in a lateral direction (x-direction) and extend in a vertical direction (z-direction). In embodiments, the trench openings 102A, 102B are cavities which extend in the vertical direction into the substrate by at least a distance exceeding the minimum lateral dimension. For example it can be observed from FIG. 1A that the trench openings 102A, 102B extend in z-direction by a distance into the substrate 100 which significantly exceeds the width w of the trench openings 102A, 102B in x-direction. In some embodiments, the trench openings 102A, 102B are cavities which extend vertical into the substrate by a distance which exceeds the minimum lateral dimension of the cavity but does not exceed the maximum lateral extension of the cavity.

The opposing surfaces of the trench openings may in some embodiments be parallel to each other. In some embodiments, the opposing surfaces are parallel to the vertical direction. Trench openings being parallel to each other may also include examples in which the trench openings are roughly parallel. Likewise, opposing surfaces being parallel to the vertical direction may also include examples in which the opposing surfaces are only roughly parallel to the vertical direction. The trench openings 102A and 102B may be formed by etching through a hard mask or photo mask vertically into the inner substrate as is known in the art of semiconductor manufacturing. In some embodiments, the trench etching may utilize deep trench etching techniques. In some embodiments, the trench openings 102A, 102B may have an aspect ratio (ratio between z-dimension and x-dimension) which lies between 1:5 and 1:100. In some embodiments the aspect ratio may be between 1:50 and 1:80. In some embodiments, the lateral width of the trench openings 102A, 102B is in the range between 100 nm and 1000 nm. In some embodiments, the vertical width (depth) of the trench openings 102A, 102B are in the range between 3 µm (microns) 50 µm. The extension in one lateral direction (y-axis) may in some embodiments exceed the extension in another lateral direction at least by a factor of 5. In other words, in some embodiments, the ratio of the maximum lateral extension and the minimum lateral extension may be at least 5. The trench openings 102A, 102B may extend along the y-axis for a distance which is in some embodiments longer than the vertical extension of the trench openings 102A, 102B. The y-axis direction may be the direction of maximum lateral extension of the trench openings 102A, 102B and the vertical extension of the trench openings 102A, 102B may therefore be smaller than the maximum lateral extension of the trench openings 102A, 102B. The dimension of the trench openings 102A, 102B in y-axis direction may however in some embodiments be smaller than the vertical dimension. In some embodiments, the trench openings 102A, 102B may extend along a straight line in the y-direction. In some embodiments, the trenches 102A, 102B may be bended or rounded along the y-direction or non-uniform or non-perpendicular. In some embodiments, each of the trenches 102A, 102B may be, when seen from a top-view, line-shaped, circular, rectangular, square-shaped, ring-shaped or spiral-shaped. However, other embodiments may include other geometrical shapes.

Between the trench openings 102A and 102B, the remaining material of the substrate forms a wall 104. The wall 104 provides for the pressure sensitive structure a flexible membrane which may be used for sensing or transducing the pressure based on a deflection of the flexible membrane. The wall 104 has in some embodiments a lateral extension between 50 nm and 3000 nm. In some embodiments the lateral extension of the wall 104 may be between 200 nm and 400 nm.

Figure 1B:
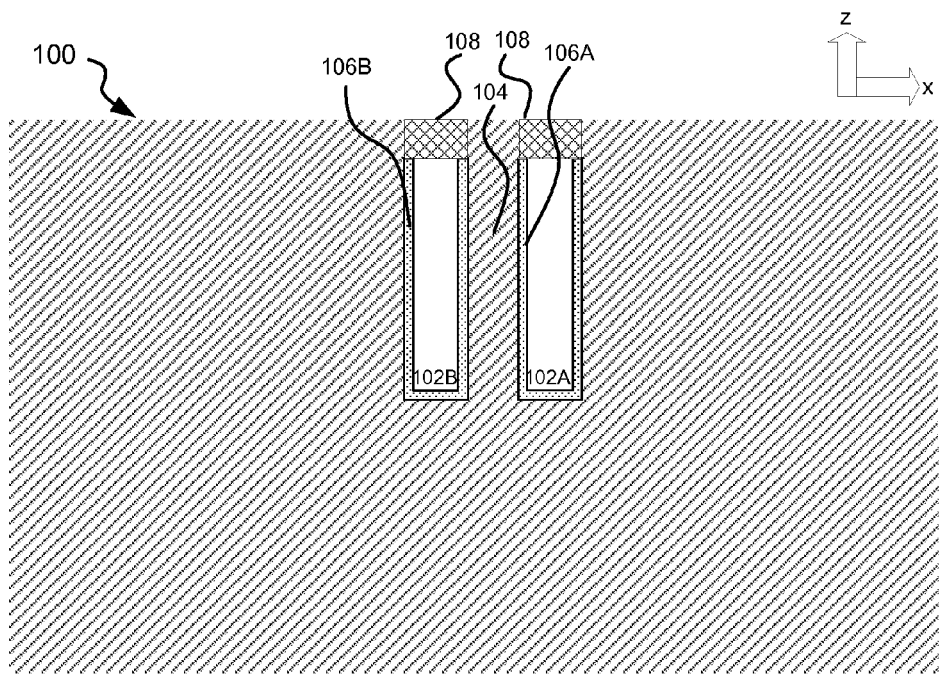

Referring now to FIG. 1B, the inner wall of the trench openings 102A, 102B are coated with thin coating layers 106A and 106B which are provided by depositing material from the first main surface side 100$a$ into the trench openings 102A, 102B. The layers 106A, 106B may in some embodiments have a thickness between 5 nm and 50 nm. The coating material includes in some embodiments nitride such as silicon nitride or other nitride compositions. In other embodiments, the coating material includes oxide material such as silicon oxide. As will be explained later in more detail, in some embodiments, the coating material is a material having in a further first selective etching a significant lower etching rate than the substrate material in order to provide an etch stop for the selective etching of substrate material. In some embodiments, the coating material may include the same material as a hard mask used for the first selective etching.

Furthermore, as can be observed from FIG. 1B, after depositing the layers 106A, 106B in the respective trench openings 102A, 102B, the trench openings 102A, 102B are sealed by filling a top part of the trench openings 102A, 102B with sealing material 108. The material is applied from the main surface side 100$a$ by using for example a HDP (High Density Plasma) process such as a HDP chemical vapor deposition (CVD) process. In some embodiments, the material may be a Silicon-Oxide applied by a HDP process which is also referred to as a HDP-Oxide.

After sealing the trench openings 102A, 102B, a first hard mask 110 is generated on the first main surface 100$a$. The first hard mask 110 has a mask opening 110$a$ which defines the starting of a later applied first etching. The mask opening 110$a$ may have in some embodiments a width (in the x-direction) between 0.1 µm and 2 µm. In some embodiments, the width of the mask opening 110$a$ is about 1 µm. The lateral distance in x-direction between the trench opening 102A and the mask opening 110$a$ of the first hard mask 110 may be between 0 and 2 µm XXX and YYY µm. In some embodiments, the mask opening 110$a$ may extend above the sealing material 108. In other words, the opening 110$a$ extends in this embodiment at least partially over the trench opening 102A.

In addition to the first mask, a second mask 112 is generated above the first hard mask 110 for providing a mask for a later applied second etching process.

It is to be understood that in some embodiments other semiconductor processes may be applied between each of the above described process steps. For example, after sealing the trench openings semiconductor process steps such as MOS or BiCMOS process steps may be applied in other areas of the substrate to generate integrated circuits including circuit elements such as MOS transistors, bipolar transistors or other active of passive integrated circuit components. The manufacturing and sealing of the trench openings 102A, 102B may therefore in some embodiments be provided during or prior to a Front-End-Of-Line (FEOL) process. The sealing of the trench openings 102A and 102B allows the applying of process steps of the FEOL process after the forming of the trench openings without adversely affecting the trench opening. For example, by sealing the trench openings, processing steps which are performed at higher temperatures can be applied after the forming of the trench openings. This allows for the integrating of the manufacturing of the pressure sensitive structure with other integrated circuit components by utilizing a CMOS or BiCMOS process, for example to achieve a pressure sensitive device with an integrated circuit for processing the sensor signals directly on the same chip. In some embodiments, the second hard mask 112 may be a mask containing material applied during a back-end-of-line (BEOL) process. FEOL typically refers to the first portion of an Integrated Circuit (IC) fabrication where the individual circuit elements such as transistors, resistors, capacitors etc. are patterned and which typically covers everything up to, but not including, the deposition of metal interconnect layers. BEOL typically refers to the second portion of IC fabrication where the various metal layers interposed by insulation layers are formed for interconnecting the circuit elements.

In some embodiments, the second hard mask 112 is formed by a structured portion of the BEOL staple having metal layers with interposed insulating layers.

The second hard mask 112 is formed to have a mask opening 112a defining the area at which the etching agent of a second etching is allowed to penetrate into the substrate. In embodiments, the area defined by the mask opening 112a includes the area defined by the mask opening 110a, when seen from a top view. In some embodiments, the area of the second mask 112 defines the pressure inlet area at main surface level as will be described below in more detail.

After having formed the first and second hard masks 110, 112, a first etching is applied to remove the substrate material lateral of the trench opening 102A. The trench opening 102A is thereby laterally extended to a cavity 102A'. The first etching may be a wet etching such as an etching with KOH-etching agent or a dry etching such as an ion reactive etching or a combination of wet and dry etching. The etching utilizes the first hard mask 110 with the mask opening 110a for defining the etching areas. In some embodiments, the first etching is an anisotropic etching which allows to obtain an inclined surface for the extended opening, i.e. a surface not perpendicular to the substrate main surface, as will be shown later with respect to FIG. 1E. In some embodiments an isotropic etching may be applied. In some embodiments, the isotropic etching may result in the cavity having a round-bodied shape.

In embodiments, the cavity extends due to the first etching by an amount between 3 and 50 μm, i.e. substantially to the same extend as the vertical extension of the trenches 102A, 102B.

Figure 7A:
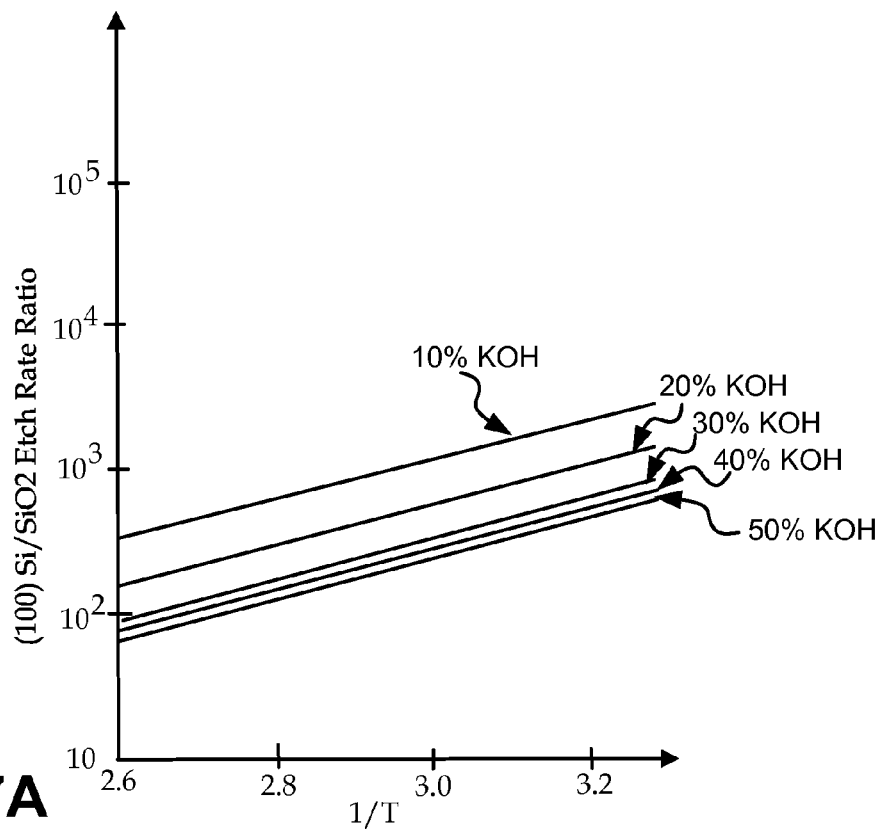
FIGS. 7A and 7B show example etching rate diagrams.
Figure 7B:
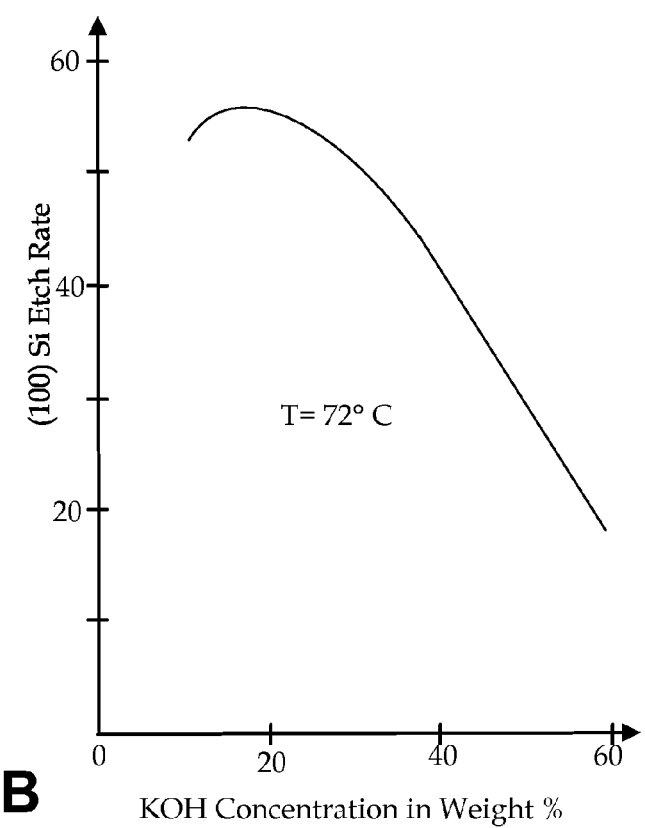

In some embodiments, the first etching is selective with respect to the material of the coating layer 106A. In other words, the etching agent for the first selective etching has an etching rate which is significantly higher for the substrate material (which in some embodiments may be silicon) than for the material of the coating layer 106A. In some embodiments, a KOH etching may be used which can be controlled by determining a concentration rate and an etching time. FIG. 7A shows an example diagram providing information on the dependency of the (100) Si/SiO2 etching rates for different KOH concentration as an inverse function of absolute temperature. It can be seen from this diagram that selectivity can be achieved between Si and SiO2 with a Si etch rate being in a range of 10 to 10000 higher than the SiO2 etch rate for. Furthermore, FIG. 7B shows a dependency of the Si etch rate as a function of the KOH concentration at a temperature of 72° Celsius. Persons skilled in the art know how to use such diagrams in order to obtain proper selective etchings for different materials.

In view of the selectivity, the first etching stops at one lateral side at the coating layer 106A which had been applied at the inner surface of the trench opening 102A. In the substrate 100, the first etching provides as a result of a non-bounded etching a surface 114 for the extended trench opening 102A'. In other words, the surface 114 is not defined by stopping on a previously provided etch stop layer but is mainly defined by the etching time and the specific etching characteristics. In the described embodiment, the second etching has therefore a stop layer only at the lateral side defined by the coating layer 106A while the etching is not stopping at a particular layer on the opposing side.

Figure 1C:
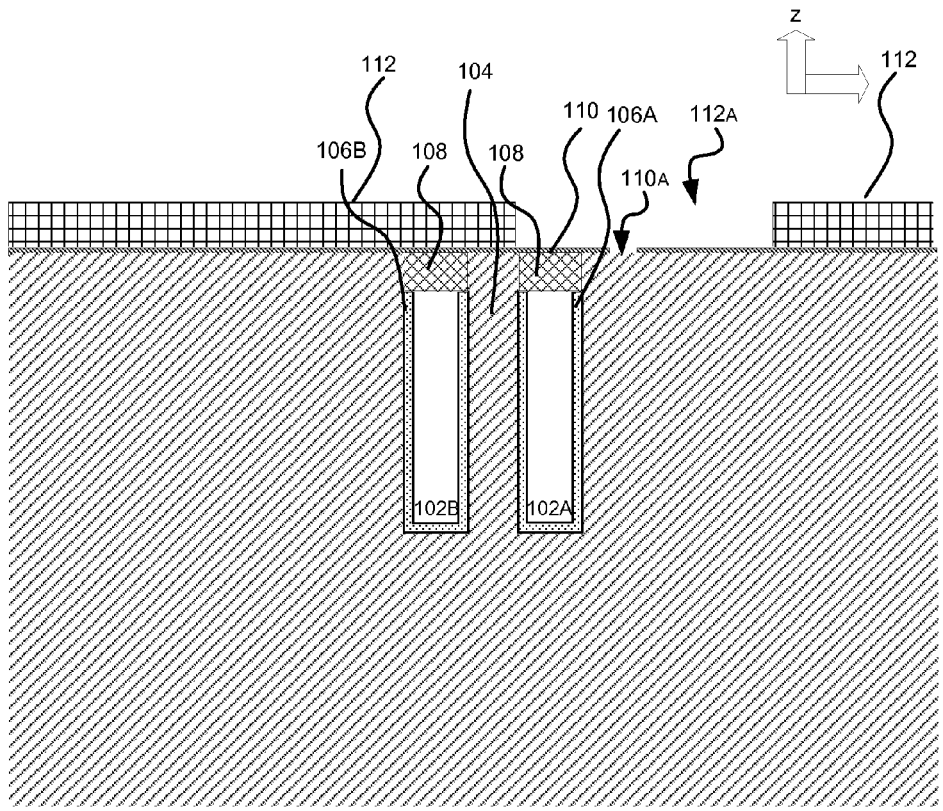
Figure 1D:
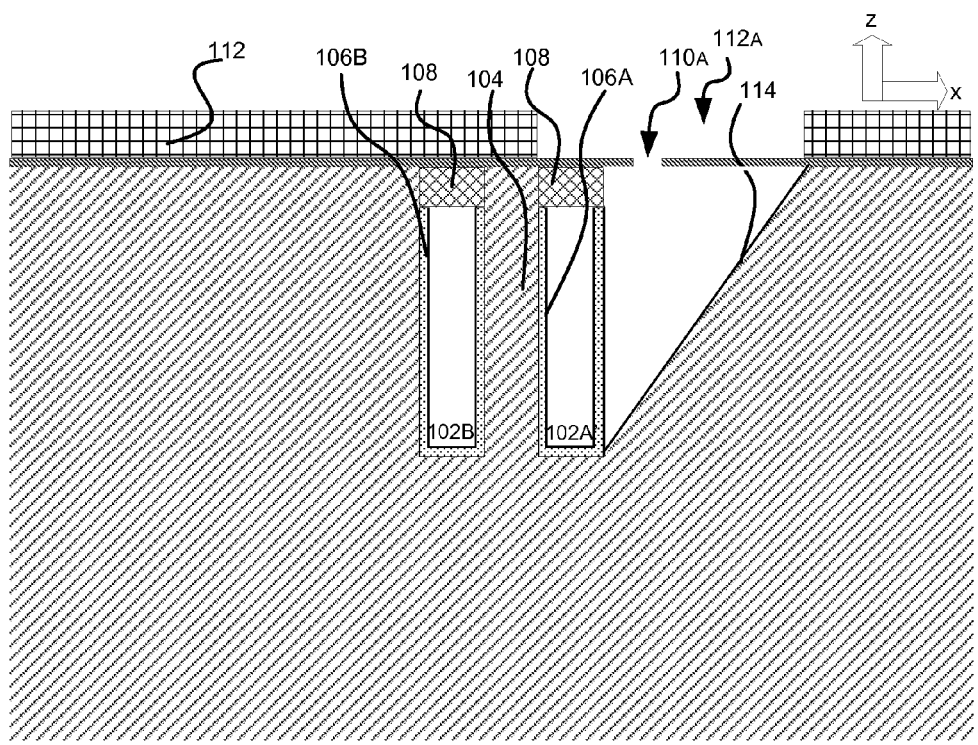

As shown in FIG. 1D, in view of the anisotropy of the etching, the surface 114 is a surface which is inclined with respect to the main surface of the substrate. In some embodiments where the substrate is a crystal silicon substrate, the surface 114 is defined by the 111 plane which has an angle of 54.74° with respect to the main surface of the substrate.

As can be seen in FIG. 1D, in view of the removal of material, a portion of the coating layer 106A of the now extended opening 102A' remains free-standing, i.e. at least partial without lateral surrounding material. The free-standing portion of the coating layer 106A may remain fixed at the top side by the sealing material 108 as shown in FIG. 1D.

In a next step, the coating layer 106A and the sealing material 108 which had sealed the trench opening 102A are removed by a second etching. The second etching is defined by the opening 112A of the second mask 112. In some embodiments, the second etching is a selective etching with a substantial higher etching rate for the material of the first hard mask 110 than for the substrate material.

Figure 1E:
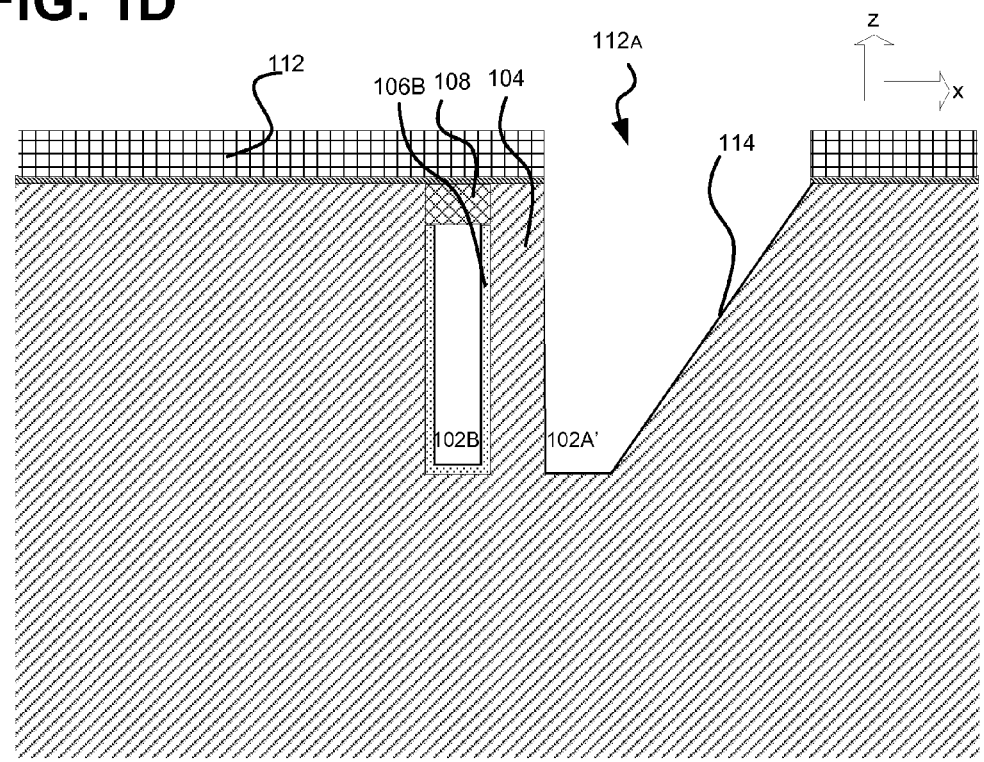

While in FIG. 1E the entire coating layer 106A is removed, in other embodiments, only the free-standing portion of the coating layer 106A may be removed by the second etching. In some embodiments also the sealing material 108 which had sealed the trench opening 102A and the section of the first hard mask 110 covering the extended opening 102A' are removed as shown in FIG. 1E. In some embodiments additional etching agents may be applied in additional etching steps to remove the sealing material 108 and the hard mask 110 or other elements.

As shown in FIGS. 1C, 1D and 1E, in some embodiments, the hard mask 112 for the second etching may remain and extend on the main surface to cover the trench opening 102A and the wall 104 in order to maintain a protective layer over the sealing material 108 of the trench opening 102A and over the wall 104.

Instead of providing the hard mask 112 extending to cover the trench opening 102A and the wall 104, the first hard mask 110 may be provided in some embodiments to be thicker at least in the region of the trench opening 102A and the wall 104 compared to the thickness of the hard mask in other regions. Furthermore, in some embodiments, an additional protection layer may be provided above at least the trench opening 102A and the wall 104 instead of the hard mask 112. This may for example be obtained after the forming of the second hard mask 112 by depositing the additional layer in the region including the trench opening 102A and the wall 104.

After the second etching is completed, in some embodiments, the first hard mask 110 and the second hard mask 112 both remain, i.e. both are not removed in later manufacturing processes.

The pressure sensitive structure may therefore include the first hard mask 110 and the second hard mask 112 as shown in FIG. 1E. As explained above, in some embodiments the second hard mask 112 is formed by a BEOL stack comprising metallic layers and insulating layers. In addition to utilizing the BEOL stack as a hard mask, additional synergetic effects may be provided in such embodiments by maintaining the BEOL stack in view of the additional electro-magnetic shielding effect provided by the metallic layers of the BEOL stack to electrodes of the pressure sensitive structure.

Furthermore, in view of the surface 114 of the cavity forming the pressure inlet being non-rectangular with respect to the main surface, the wall 104 and the inclined surface 114 being the lateral side walls of the inlet are provided non-parallel to each other, for example with an inclination angle in the range between 40° and 70°. In an embodiment, the inclination angle is about 55° corresponding to the inclination of the silicon 111 plane.

The pressure inlet therefore has lateral surfaces which are not parallel but are inclined to each other. This allows liquids such as water droplets to escape more easily from the cavity forming the pressure inlet compared to other shapes of the inlet such as rectangular shapes. In such embodiments, the shape of the inlet being the result of the etching process and being defined by the etching process can be synergistically used to provide a pressure sensitive structure which is more robust against environmental influences such as liquids and moisture.

In the embodiment of FIGS. 1A to 1E, it can be further observed from FIG. 1E that the second mask defines the extension of the cavity forming the pressure inlet at least for one lateral side of the cavity.

In some embodiments, the electrodes of the pressure sensitive structure are formed by the wall 104 acting as a first deflectable electrode and the substrate material lateral to the trench opening 102A acting as a counter electrode. As both electrodes are formed in such embodiments mainly of material of the substrate, the substrate material may be provided to be an electrical conducting material such as for example crystalline silicon. P-doping and n-doping regions may be provided to form p-n junctions isolating the wall 104 from the counter electrode. The pressure may in some embodiments be sensed by sensing a change of the capacitance caused by a deflection of the deflectable electrode. Such sensing may be provided for example by applying an AC signal to the electrodes. Other sensing techniques known to persons skilled in the art may be further be used to detect the deflection of the deflectable electrode.

Figure 2:
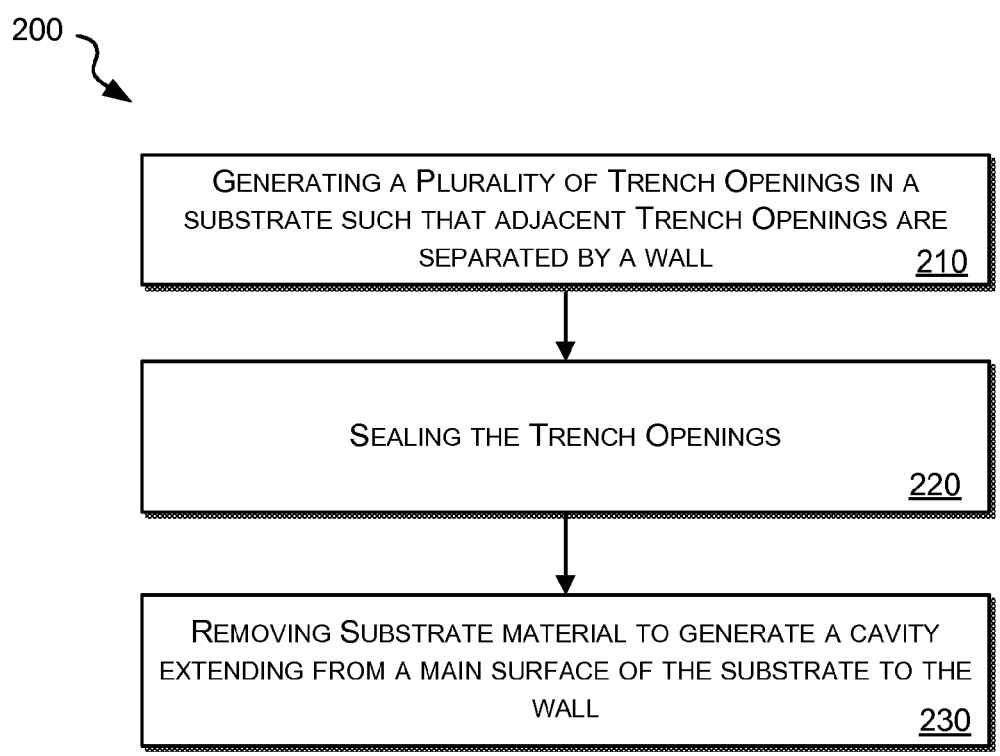
FIG. 2 shows a flow chart diagram according to an embodiment.

A flow diagram 200 of a basic manufacturing process for producing a pressure sensitive device according to embodiments will now be explained with respect to FIG. 2.

The flow diagram 200 starts at 210 with the generating of a plurality of trench openings in a substrate such that adjacent trench openings are separated from each other by a wall. As outlined above, the trench openings may in some embodiments include deep trench opening. Then, the trench openings are sealed at 220.

At 230, substrate material is removed to generate a cavity extending from the main surface of the substrate to the wall. The thus generated cavity provides an inlet for the pressure sensitive device such that the pressure of the environment is present at the pressure sensitive wall.

It is to be noted that in the above process the trench openings may be etched from the same main surface side to which the inlet extends in order to provide communication with outside pressure. Compared to etching the inlet from the main surface of the backside, the above described process allows a less complex and cost-effective manufacturing. The sealing allows protecting the sensitive areas such that other manufacturing steps may be applied after forming the trenches. The above process can be integrated into a BiCMOS or CMOS process wherein the active elements are formed at the same main surface side. After the BiCMOS or CMOS process, at least one trench opening is extended by the removing of substrate material lateral to the trench opening to form the cavity providing for the pressure inlet. By having the trench openings sealed and then removing material to extend at least one trench opening to form the pressure inlet, the pressure inlet formed thereby is protected from the influence of any process steps such as BiCMOS process steps which may be performed between the sealing of the trenches and the extension of the trench opening. In some embodiments, FEOL process steps and BEOL process steps may be performed between the sealing and the extension of the trench opening. As already outlined, in such embodiments, the BEOL stack can be used as a mask for one of the etching steps.

While FIGS. 1A-1E show an embodiment with a plurality of two trench openings, a further embodiment will be shown with respect to FIGS. 3A-3E wherein a plurality of more than two trench openings are formed in order to manufacturing a plurality of pressure sensitive walls and a reference cavity.

Figure 3A:
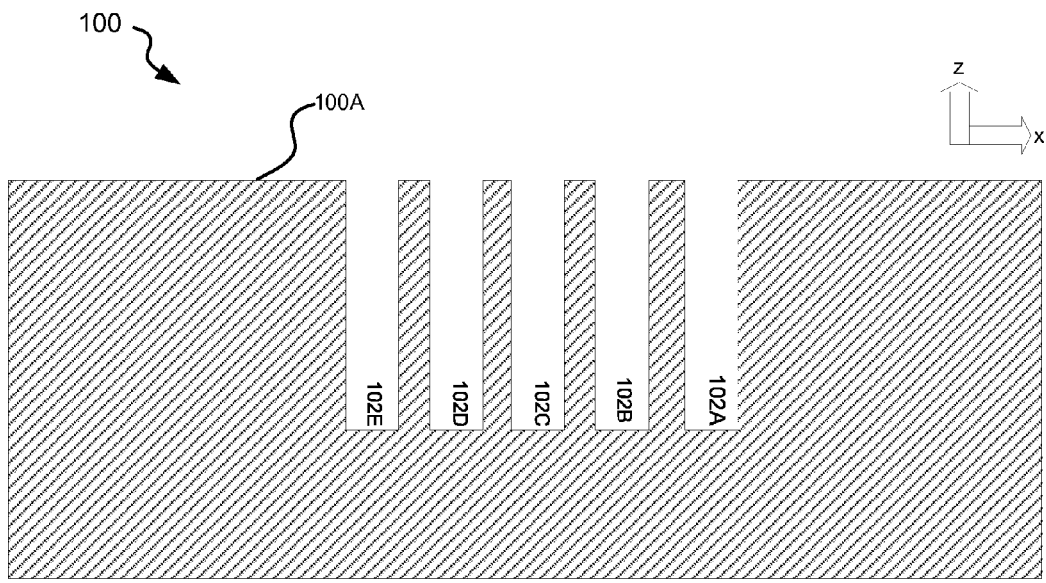
FIGS. 3A to 3E show example schematic cross-sectional views according to an embodiment.
Figure 3B:
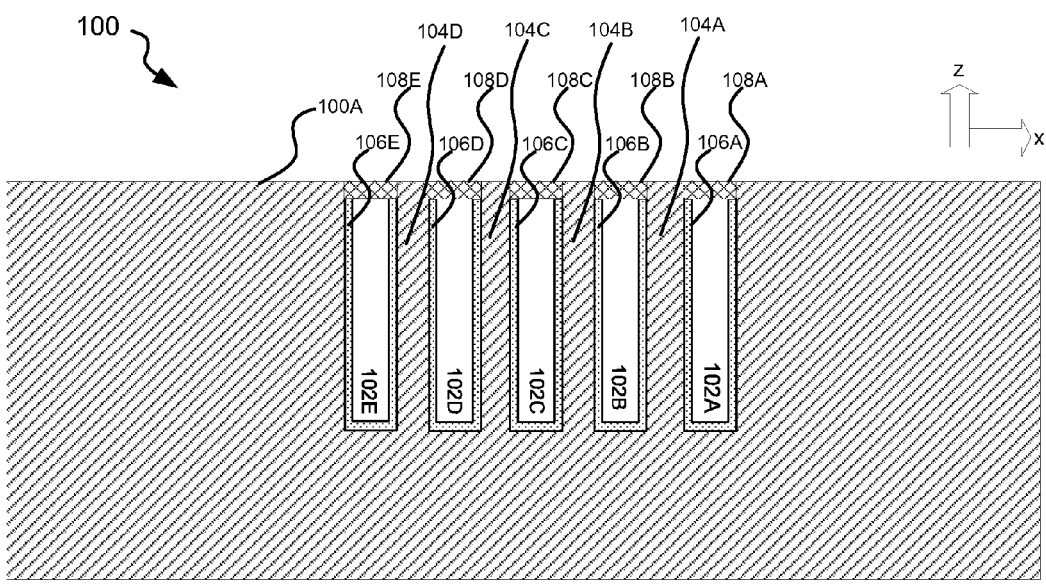

Referring to FIG. 3A, a multiplicity of 5 trench openings 102A to 102E is formed in the substrate 100. As shown in FIG. 3B, the trench openings 102A to 102E are coated with respective layers 106A to 106E at the inner surface and sealed with sealing material portions 108A to 108E provided for each of the trench openings 102A to 102E as already described above.

Figure 3C:
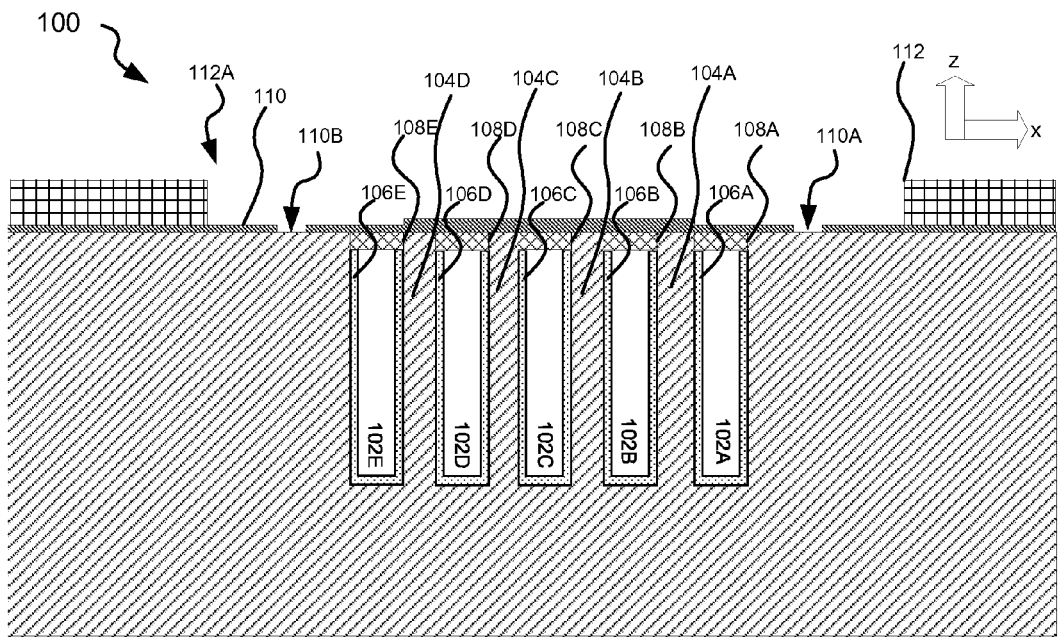

Referring to FIG. 3C, the first hard mask 110 with mask openings 110A and 110B near the respective lateral sides of the outer-most trench openings 102A and 102E and the second hard mask 112 with the mask opening 112A are formed. As can be seen, the hard mask is formed at the main surface 100a thicker in an area including trench openings 102B to 102D and walls 104A to 104D compared to other sections.

Figure 3D:
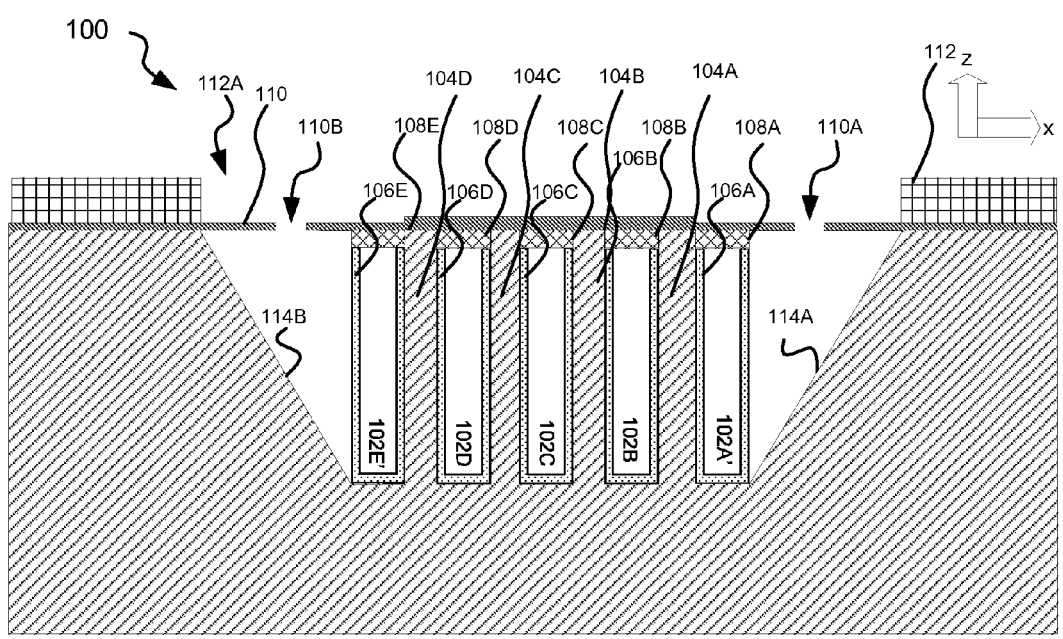

FIG. 3D shows a view after the first selective etching. The first selective etching removes at both lateral sides substrate material so that the outer most trench openings 102A and 102E are extended to form extended openings 102A' and 102E'. The extended openings 102A' and 102E' include the respective coating layers 106A and 106E as free-standing structures, i.e. with no lateral support. The thereby formed extended openings 102A' and 102E' have the respective inclined surfaces 114A and 114B formed by the first selective etching of substrate material.

Figure 6:
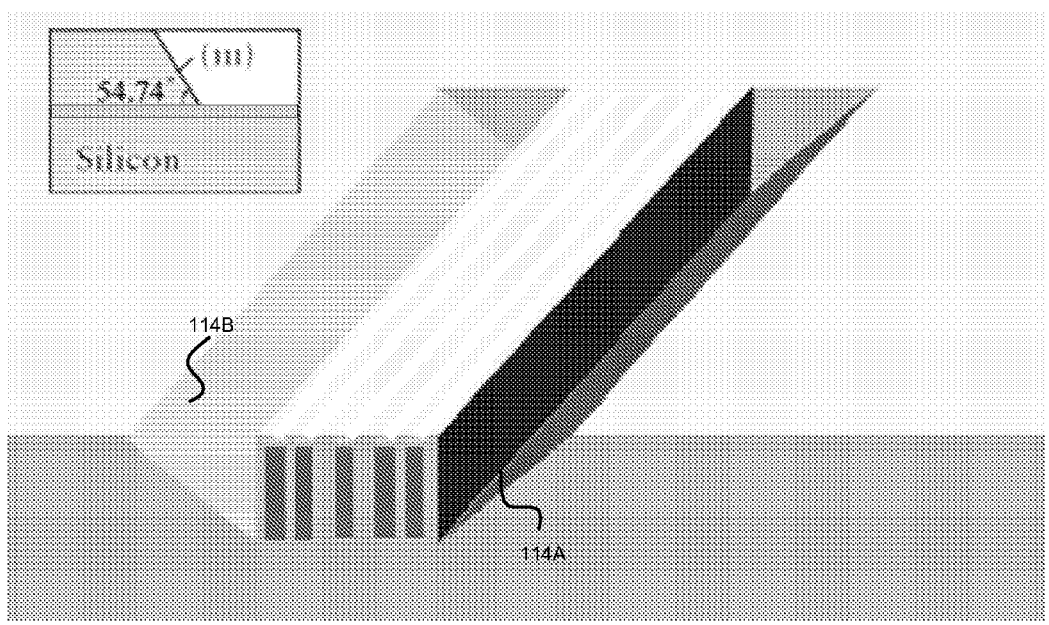
FIG. 6 shows an example three-dimensional view of a cut.

FIG. 6 shows an example three-dimensional view of a cut through a pressure sensitive structure. The structure shown in FIG. 6 corresponds to the structure shown in FIG. 3D when the surfaces 114A, 114B are etched to be parallel to the 111 plane of crystal silicon. In this example, the inclined surfaces 114A, 114B therefore have an angle of 54.74° with respect to the main surface is indicated in FIG. 6.

Figure 3E:
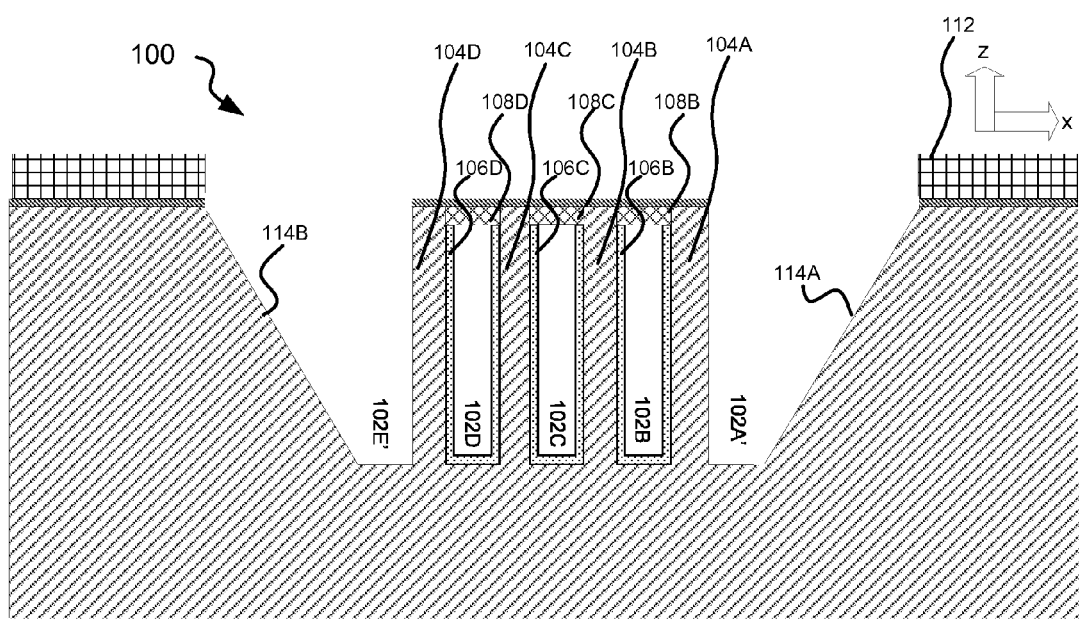

FIG. 3E shows a view after applying the second selective etching. The second selective etching removes the remaining coating layers 106A and 106E and stops at the respective walls 104A and 104D. Furthermore, as shown in FIG. 3E, the second selective etching may remove the sealing material portions 108A, 108E of the outermost trenches and the first hard mask 110 in the section defined by the extended openings 102A' and 102E'.

In FIG. 3E, the vertical extending walls 104A and 104D, each form the pressure sensitive lamella for the pressure sensitive structure. Furthermore, the walls 104B and 104C form respective counter-electrodes for the walls 104A and 104D. Each of the sealed trenches 102B and 102D forms a compartment with a predefined pressure. The compartments are laterally bound on one side by the walls 104A, 104D which are subjected to the environmental pressure and at the other lateral side by the inner walls 104B, 104C, respectively. Thus each of the sealed trenches 102B and 102D establishes a pressure sensitive element.

The sealed trench 102C forms a reference chamber allowing establishing a reference element which is not sensitive to the environment pressure, i.e. the pressure to be sensed. In some embodiments, a reference element and a pressure sensitive element may be connected in a circuit, for example in a half bridge of the Wheatstone type or in a full bridge of the Wheatstone type. This allows eliminating effects on the pressure sensor signal caused for example by a temperature change. Furthermore, with the above described manufacturing, the reference elements and the two pressure sensitive elements can be obtained very dense on a semiconductor chip which results in reduced chip area.

In view of the increased thickness of the first hard mask 110, a part of the first hard mask 110 remains above the walls after the second etching. The remaining part of the first hard mask 110 allows providing additional protection against environmental effects and harmful agents.

Referring now to FIGS. 4A to 4E, a further embodiment will be explained. While in the embodiments of FIGS. 1A to 1E and FIGS. 3A to 3E the removing of substrate material extends an upper part of at least one trench opening in a lateral direction while at the bottom part of the trench opening roughly no extension is provided, the embodiment according to FIGS. 4A to 4E provide an example wherein also the bottom part is extended. Furthermore, in this embodiment, the pressure inlet has also an increased lateral extension compared to the embodiments described with respect to FIGS. 1A-1E, 3A-3E. In the embodiments at the main surface level.

In general, the lateral extension of the cavity resulting from the removing of material lateral to the trench openings can be controlled by the size of the mask openings and the etching techniques used.

Figure 4A:
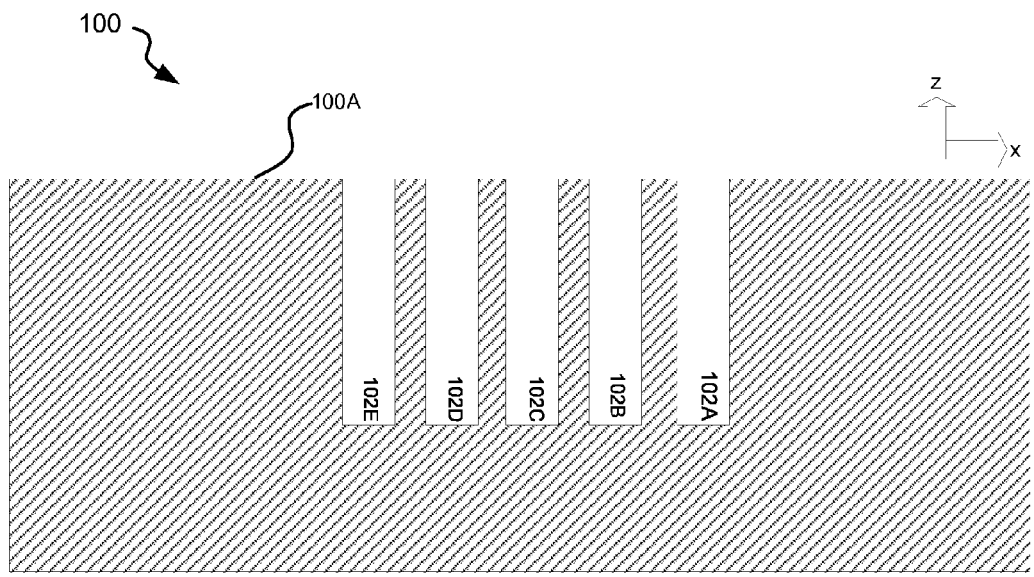
FIGS. 4A to 4E show example schematic cross-sectional views according to an embodiment.
Figure 4B:
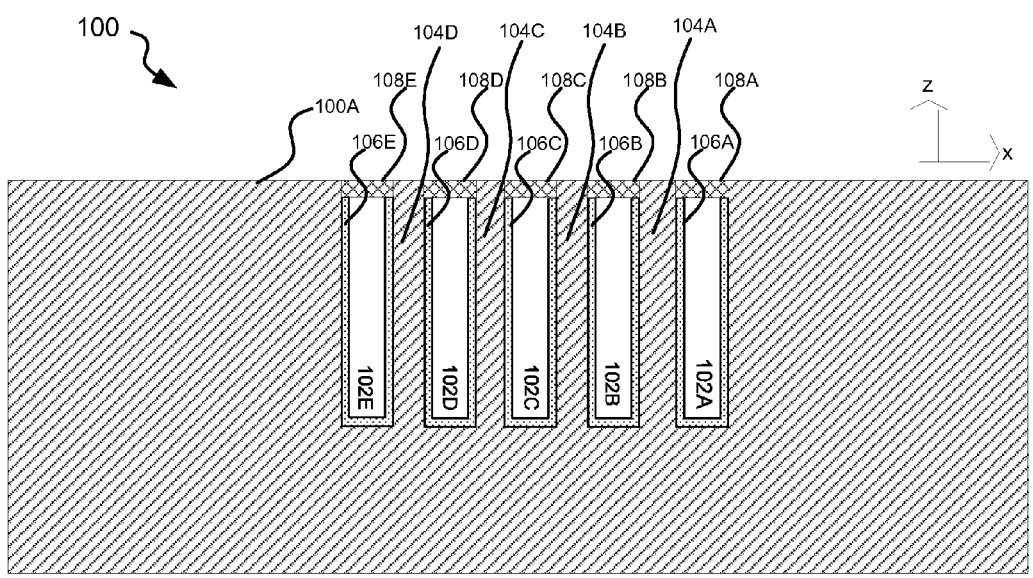
Figure 4C:
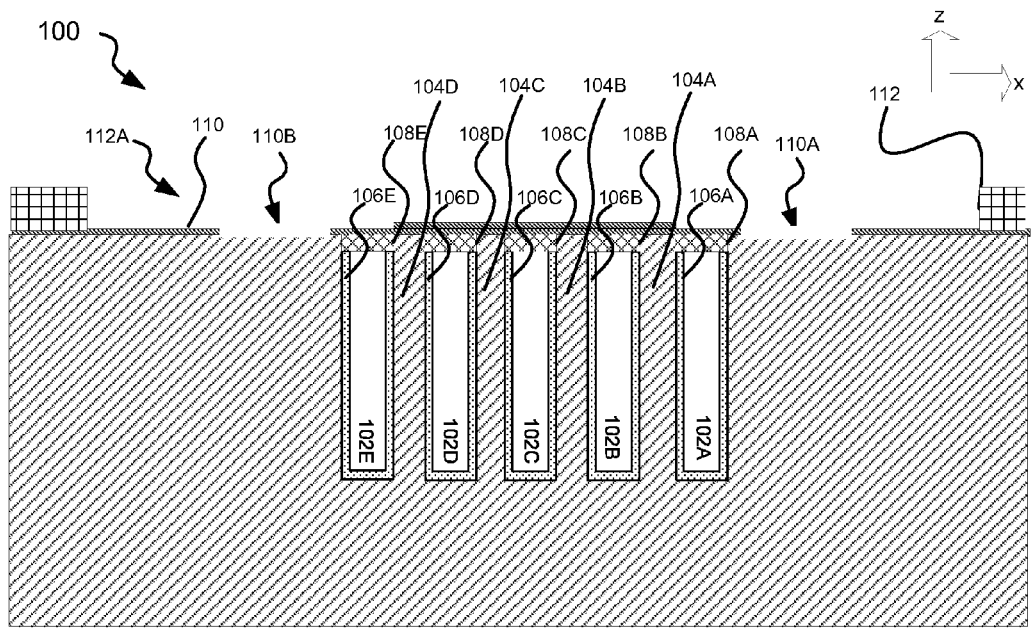

In the embodiment of FIGS. 4A to 4E, FIGS. 4A and 4B correspond to FIGS. 3A and 3B and reference is made to the corresponding description. Referring now to FIG. 4C, distinguished from the embodiment of FIGS. 3A to 3E, the first hard mask 110 is formed with an increased lateral dimension of the mask openings 110A and 110B. In addition, also the second hard mask 112 defines an increased area in order to allow the pressure inlet having an increased area at the main surface level.

Figure 4D:
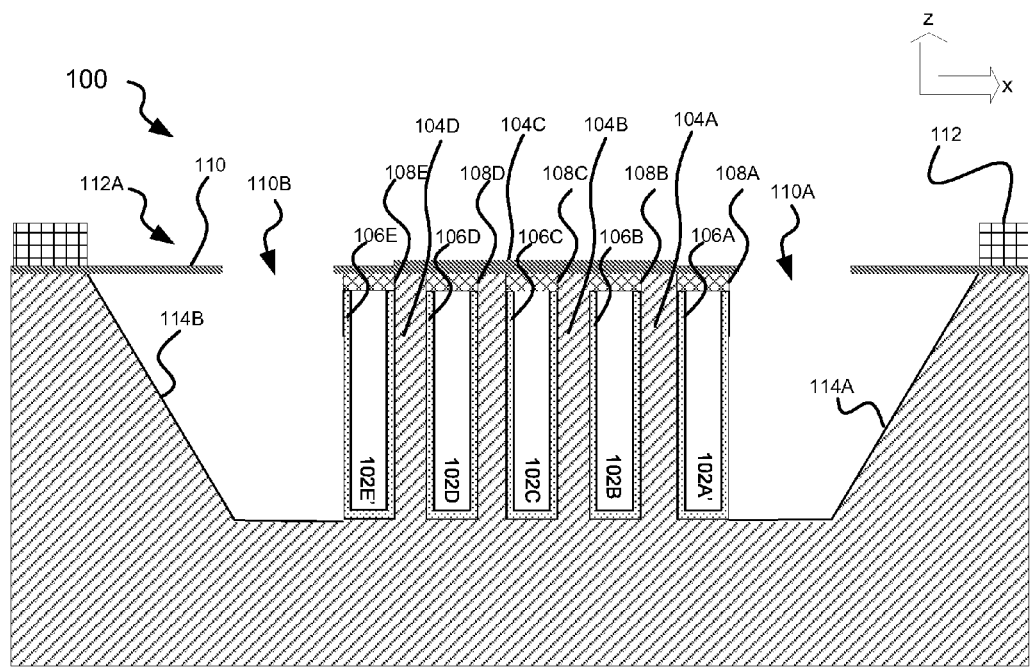
Figure 4E:
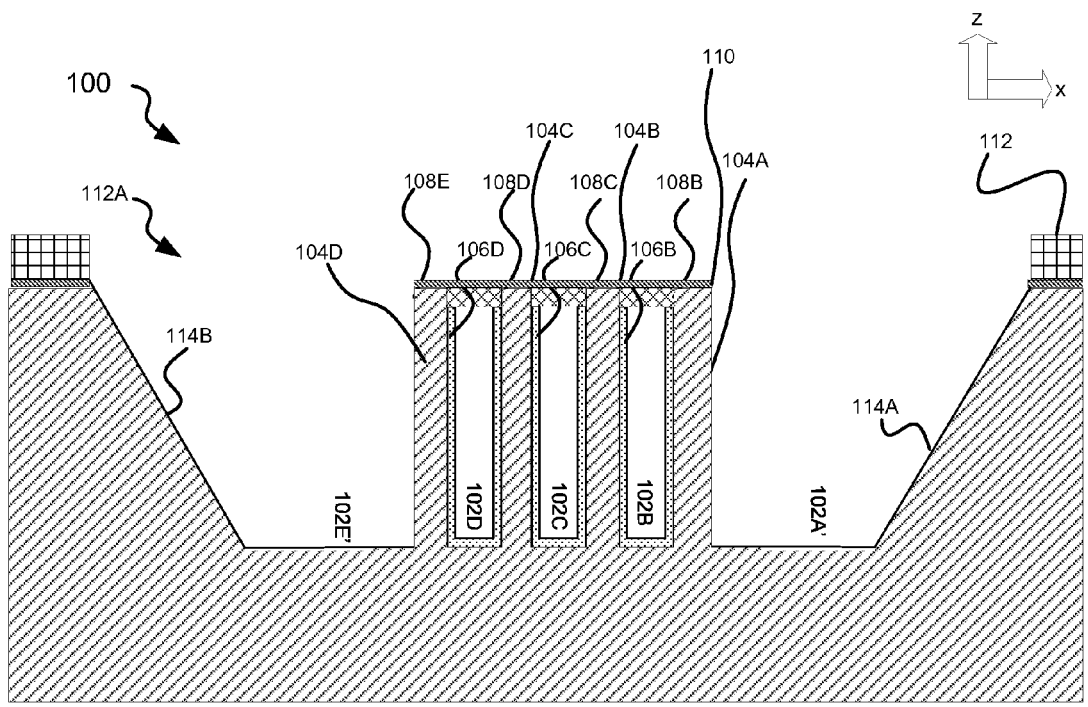

Referring to FIGS. 4D and 4E, similar to the embodiment of FIGS. 3A to 3E, the first selective etching and the second selective etching are applied. As can be seen from FIG. 4E, the extension of the trench openings 102A and 102E results in cavities 102A' and 102E' with a lateral extended bottom part. The bottom part of the cavities 102A' and 102E' has therefore a lateral dimension which exceeds the respective lateral dimension of the original trench openings 102B, 102C, 102D.

Furthermore, in view of the lateral extended mask openings 110A, 110B, the respective maximum lateral extension of the cavities 102A', 102E' obtained at the main surface level exceeds the respective maximum lateral extension of the cavities 102A' and 102E' obtained in the embodiment of FIGS. 3A to 3E.

A further embodiment using one hard mask layer for removing material lateral to the initially formed trenches and removing at least a part of the trench opening walls to form the inlet will now be described with respect to FIGS. 5A to 5E. The process uses the hard mask layer for a first and second etching in order to remove the substrate material lateral to the initially formed trench openings and to remove at least one side wall of the outermost initially formed trench openings. In addition to the removing of the at least one side wall, the sealing material portions of at least the outermost initially formed trench openings may be removed in the second etching. In embodiments a third etching applied after the first and second etching may be used to remove the hard mask layer.

Figure 5A:
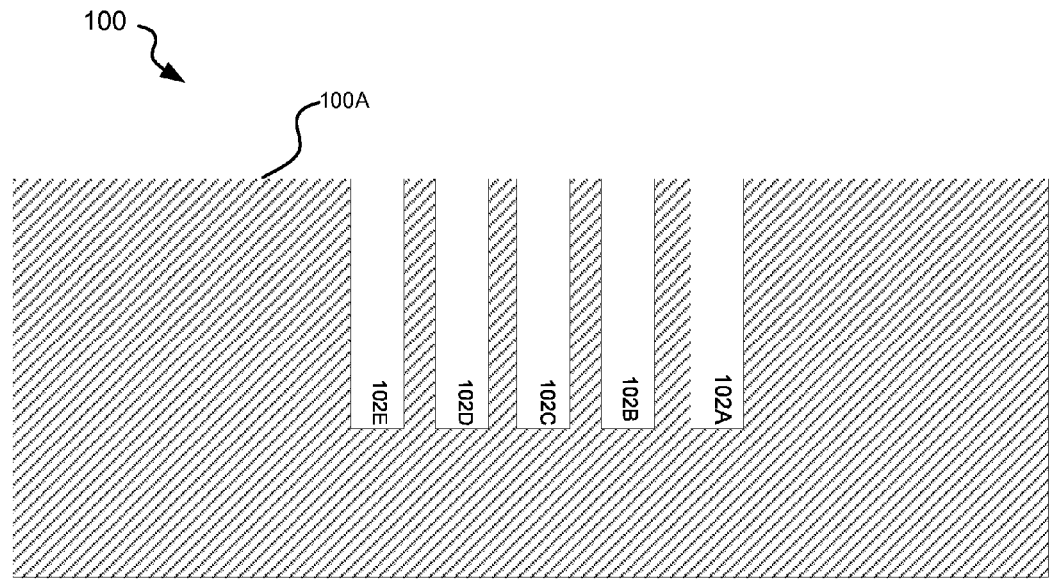
FIGS. 5A to 5F show example schematic cross-sectional views according to an embodiment.
Figure 5B:
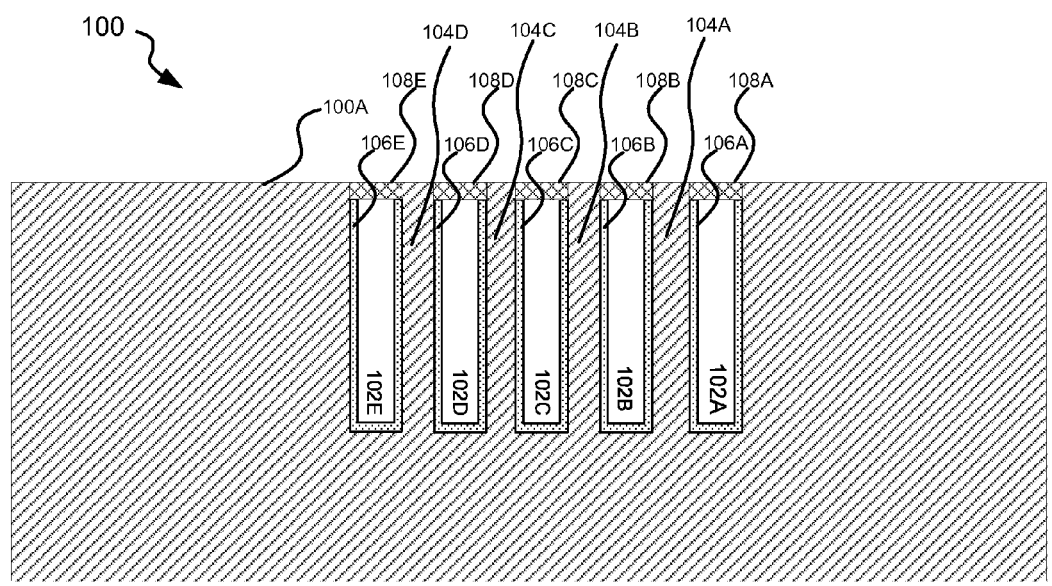

The process starts with the forming of the trench openings 102A to 102E in the substrate 100 as shown in FIG. 5A. The inner walls are coated with the layers 106A to 106E followed by the sealing of the trench openings with sealing material 108 to obtain the sealing material portions 108A to 108E as shown in FIG. 5B. FIGS. 5A and 5B correspond to FIGS. 3A and 3B and therefore reference is made to the detailed description with respect to FIGS. 3A and 3B.

Figure 5C:
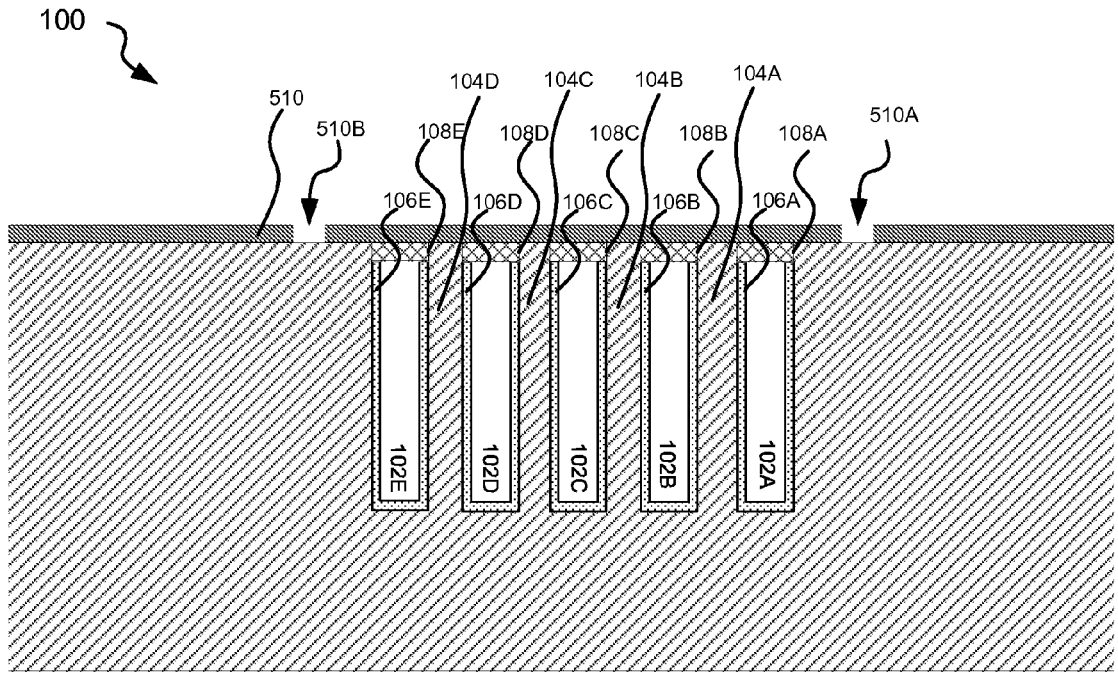

Referring now to FIG. 5C, a hard mask layer 510 is applied to provide the mask required for the first and second etching. The hard mask layer 510 is structured such that s mask openings 510A and 510B are provided for defining the etching area during the etching.

Figure 5D:
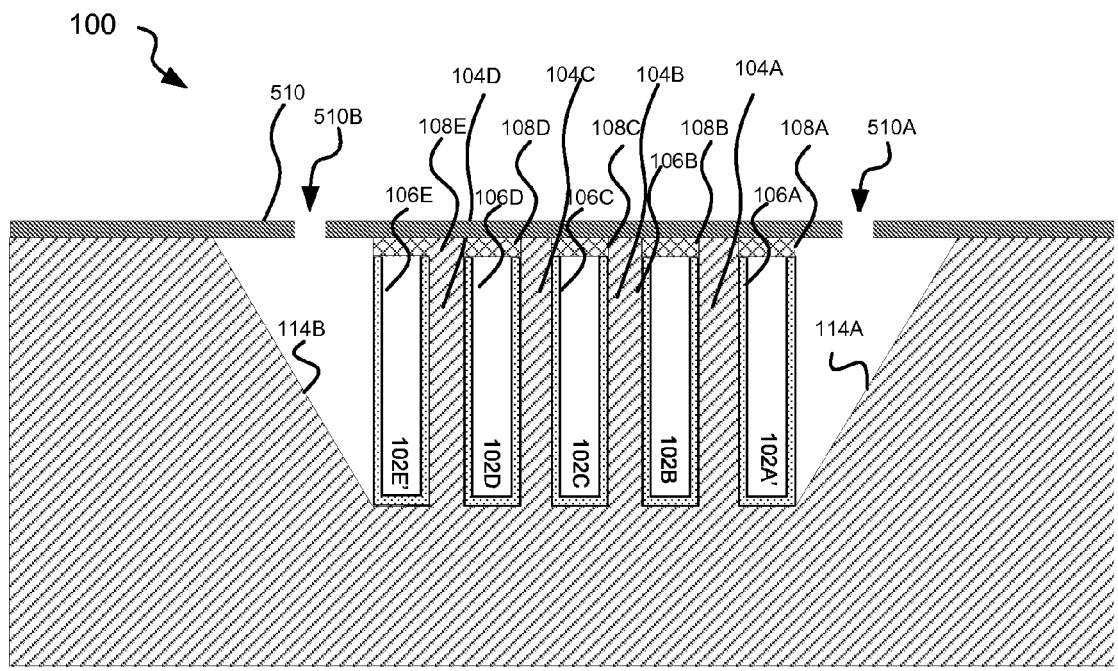

Similar to the previously described embodiments, the first etching is a selective etching which removes the substrate materials while it stops at the layers 106A and 106E and the sealing material portions 108A and 108E of the outermost trenches, see FIG. 5D. Thereby, the outer side of the layers 106A and 106E are provided free-standing, i.e. with no lateral support as shown in FIG. 5D. Similar to FIG. 3D, the first etching generates on each side of the group of trenches 102A to 102E a cavity with inclined surface 114A and 114B, respectively.

Figure 5E:
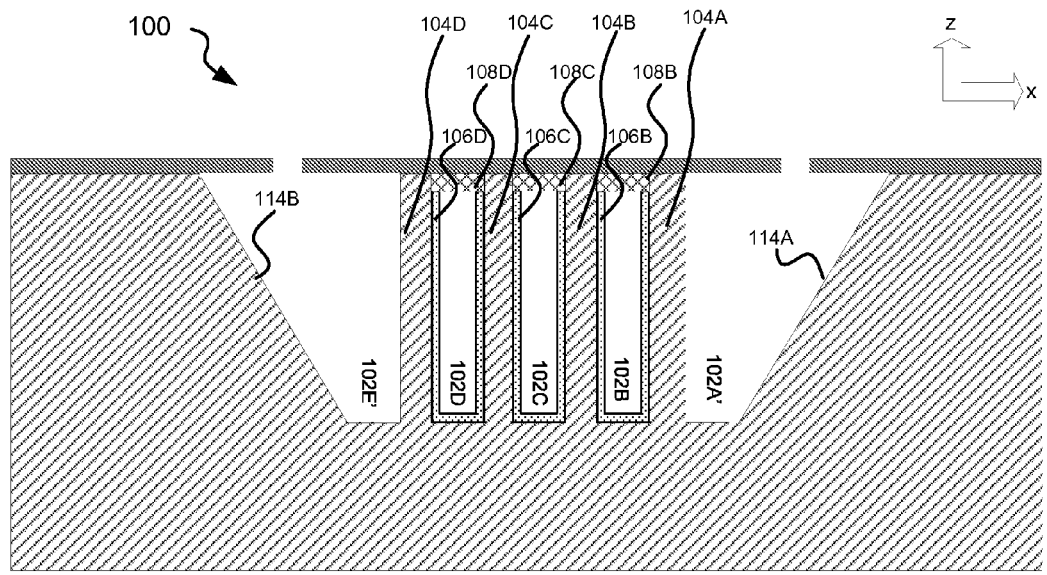

In a second selective etching, the free-standing portions of the layers 106A, 106E are removed together with the corresponding sealing material portion 108A, 108E. FIG. 5E shows the free-standing portions of layers 106A, 106E and sealing material portion 108A, 108E removed such that the outermost trenches 102A and 102E are laterally extended. Note that the second etching uses the same mask layer 510 used for the first etching which results in the mask layer 510 still remaining after the second etching.

Figure 5F:
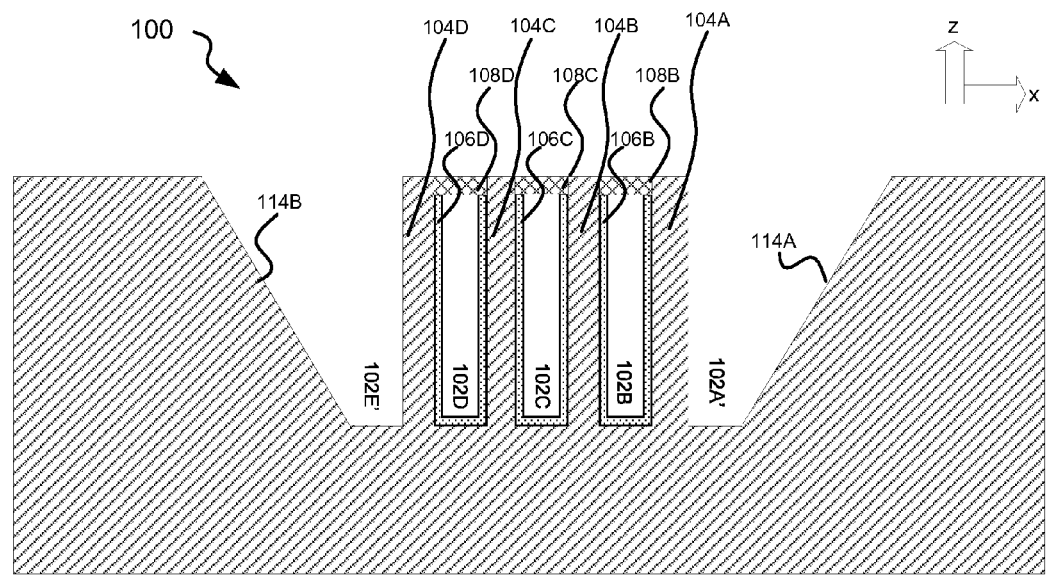

Referring now to FIG. 5F, the mask layer 510 is removed by a third etching which is selective to the substrate material and the material of the sealing material portions. In other words the third etching removes the mask layer 510 while it stops on the substrate material and the sealing material portions. This allows that the extended cavity is opened at the main surface side to obtain a channel to the flexible membranes provided by the walls 104A and 104D allow the usage of the structure as pressure sensitive device.

In the above described embodiment, the layers 106A to 106E may have a same material as the material used for sealing the trenches which allows the same etching rates in the first etching for the layers 106A and 108E and the sealing material portions 108A and 108E. However, any materials may be used for the trench sealing portions 108A to 108E and the layers 106A to 106E which allow a selective removal of this material by using the hard mask 510. In one embodiment, the material may for example include an oxide material such as silicon oxide. The mask layer 510 may then for example be comprised of nitride material which allows removing the silicon substrate material in the first selective etching and the silicon oxide material in the second selective etching by using the mask layer 510 as hard mask. It is to be noted that the second selective etching may to a lesser extend also remove further substrate material although this is not shown in detail in FIGS. 5E and 5F.

It is to be noted that the above described embodiment may be modified in many ways. For example, the process may be modified to include an extension of the bottom part during the first etching similar to the embodiment shown in FIGS. 4A to 4E. In other embodiments, the mask opening 510A, 510B may be modified between the first and second etching such that the shape and/or size of the mask opening for the first etching is different to the shape and/or size of mask opening for the second etching.

Furthermore, although the embodiments shown describe the usage of an anisotropic etching, other embodiments may include the usage of isotropic etching steps for the first and/or the second selective etchings.

In the above description, embodiments have been shown and described herein enabling those skilled in the art in sufficient detail to practice the teachings disclosed herein. Other embodiments may be utilized and derived there from, such that structural and logical substitutions and changes may be made without departing from the scope of this disclosure.

This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

It is further to be noted that specific terms used in the description and claims may be interpreted in a very broad sense. For example, the terms "circuit" or "circuitry" used herein are to be interpreted in a sense not only including hardware but also software, firmware or any combinations thereof.

It is further to be noted that embodiments described in combination with specific entities may in addition to an implementation in these entity also include one or more implementations in one or more sub-entities or sub-divisions of said described entity.

The accompanying drawings that form a part hereof show by way of illustration, and not of limitation, specific embodiments in which the subject matter may be practiced.

In the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons.

Furthermore, in some embodiments a single step may include or may be broken into multiple sub steps. Such sub steps may be included and part of the disclosure of this single step unless explicitly excluded.

What is claimed is:

1. A method of manufacturing a pressure sensitive structure comprising:
   generating a plurality of trenches in a substrate, wherein adjacent trenches are separated from each other by a respective side-wall, wherein generating the plurality of trenches comprises:
   etching trench openings;
   forming a coating layer on a surface of each respective trench opening, wherein the coating layer comprises material different from a material of the substrate; and
   sealing the respective trench opening; and
   after generating the plurality of trenches, removing material to generate a cavity extending from a main surface of the substrate to at least one side-wall, wherein removing material comprises:
   applying a first selective etching with a higher etching rate for the material of the substrate compared to the material of the coating layer to allow a stopping of the first selective etching on the coating layer of said at least one side-wall; and applying a second etching, the second etching removing at least partially the coating layer of at least one of the plurality of trenches.

2. The method according to claim 1, wherein the first selective etching and the second etching includes at least one of a dry etching step or a wet etching step.

3. The method according to claim 2, wherein the first selective etching and the second etching are applied to remove material from a same main surface of the substrate.

4. The method according to claim 1, wherein the second etching is a selective etching with a higher etching rate for the material of the coating layer compared to the material of the substrate.

5. The method according to claim 1, wherein the method further comprises:
    forming a mask for the first etching on said main surface, wherein the mask includes at least one mask opening such that an etching agent of the first etching penetrates during the first etching through the at least one mask opening to the substrate material.

6. The method according to claim 1, wherein the first selective etching is an anisotropic etching.

7. A method of manufacturing a pressure sensitive structure, the method comprising;
    generating openings in a substrate, the openings extending from a first main surface vertically into the substrate, wherein a wall extending vertically into the substrate is formed between at least one pair of adjacent openings, wherein said generating of the openings in the substrate comprises an etching of openings and generating a layer on an inner surface of the openings; and
    removing of further material that includes a portion of the substrate at a lateral side of a first opening of the at least one pair of openings and at least a part of the layer covering an inner surface of the first opening to laterally extend the first opening within the substrate, wherein said removing of further material comprises a first selective etching and a second selective etching,
    the first selective etching removing the portion of the substrate at lateral side of the first opening and stopping on the layer covering the inner surface of the first opening, and
    the second selective etching removing the part of the layer covering the inner surface of the first opening.

8. The method according to claim 7, wherein the removing of further material comprises an etching process wherein an etching agent penetrates to the material of the substrate from the first main surface of the substrate.

9. The method according to claim 8, further comprising sealing the openings after the generating of the openings.

10. The method according to claim 9, wherein the wall forms a pressure sensitive membrane and the extended first opening is capable to provide a pressure exchange with a surrounding atmosphere.

11. The method according to claim 7, wherein said first selective etching comprises an etching of material of the portion of the substrate, wherein the etching of the material of the portion of the substrate is stopped on a coating of the layer that is on a side wall of the first opening.

12. The method according to claim 7, wherein a lateral dimension of the first opening at a main surface level is increased by said removing of the further material of the substrate.

13. The method according to claim 12, wherein a lateral dimension at a bottom level of the first opening is increased by said removing of further material of the substrate.

14. The method according to claim 7, wherein at least one further opening of the openings forms a cavity for a reference pressure.

15. The method according to claim 7, wherein the openings are generated prior to or during a Front-end-of-line manufacturing and the further material is removed during or after a Back-end-of-line manufacturing.

16. The method according to claim 7, wherein the first and second selective etchings are applied after a Back-end-of-line process, wherein at least a part of layers deposited during the Back-end-of line process forms a hard mask for at least one etching.

17. The method according to claim 7, wherein the first selective etching has a higher etching rate for the substrate than for the layer covering the inner surface of the first opening to remove the portion of the substrate and to stop on the layer covering the inner surface of the first opening.

18. The method according to claim 17, wherein the second selective etching has a higher etching rate for the layer covering the inner surface of the first opening than the portion of the substrate.

19. The method according to claim 7, wherein the second selective etching follows the first selective etching.

* * * * *